United States Patent

Esrom et al.

[11] Patent Number: 5,149,377
[45] Date of Patent: Sep. 22, 1992

[54] COATING APPARATUS

[75] Inventors: Hilmar Esrom, Heidelberg, Fed. Rep. of Germany; Ulrich Kogelschatz, Hausen, Switzerland

[73] Assignee: Asea Brown Boveri Aktiengesellschaft, Mannheim, Fed. Rep. of Germany

[21] Appl. No.: 538,829

[22] Filed: Jun. 15, 1990

[30] Foreign Application Priority Data

Jun. 15, 1989 [DE] Fed. Rep. of Germany ....... 3919538

[51] Int. Cl.⁵ .............................................. C23C 16/48
[52] U.S. Cl. .................................. 118/722; 118/723; 427/541
[58] Field of Search ................ 118/722, 723; 427/54.1

[56] References Cited

U.S. PATENT DOCUMENTS

| 4,500,565 | 2/1985 | Hiramoto | 427/39 |
| 4,516,527 | 5/1985 | Sugioka | 118/723 |
| 4,825,806 | 5/1989 | Tawada | 118/723 |

FOREIGN PATENT DOCUMENTS

| 60-24373 | 2/1985 | Japan | 427/53.1 |
| 60-43487 | 3/1985 | Japan . | |
| 60-106969 | 6/1985 | Japan | 118/725 |

Primary Examiner—Richard Bueker
Attorney, Agent, or Firm—Herbert L. Lerner; Laurence A. Greenberg

[57] ABSTRACT

An apparatus for coating substrates by photolytic dissociation or decomposition of a coating material includes a reactor vessel. A UV radiation source and the substrate to be coated are both disposed in the reactor vessel.

7 Claims, 2 Drawing Sheets

COATING APPARATUS

The invention relates to an apparatus for coating substrates having a UV radiation source and a feed line for a process gas.

Such apparatus are preferably used in coating processes effected by photolytic dissociation. Such coatings are employed not only for constructing semiconductors, but also for improving surfaces, especially for hardening the same, for forming bright layers, and for producing scratch resistance and corrosion protection of such surfaces. With the facilities known to date, the photolytic dissociation is carried out through the use of UV radiation, that is directed into a coating apparatus, in which the substrates to be coated are disposed.

A disadvantage of such coating apparatus is that there is direct deposition of the coating material onto the inside of the window, through which the UV radiation enters the coating apparatus, without additional measures The window must be separated from the process gas with the aid of a gas curtain of an inert gas, requiring recourse to expensive structures. In the case of the employment of very shortwave radiation with a wave band of less than 200 nm, the choice of the window material is severely limited Moreover, a decrease in the transparency of the window material is observed in the case of intensive UV radiation.

It is accordingly an object of the invention to provide a coating apparatus, which overcomes the hereinafore-mentioned disadvantages of the heretofore-known devices of this general type and which enables simple coating of substrates.

With the foregoing and other objects in view there is provided, in accordance with the invention, an apparatus for coating a substrate, comprising a reactor vessel, a substrate disposed in the reactor vessel, a UV radiation source disposed in the reactor vessel, and a feed line for feeding a process gas into the reactor vessel for coating the substrate.

An advantage of the apparatus according to the invention is that the deposition temperature can be held very low. When the apparatus according to the invention is employed, the coating of the substrate can be carried out at room temperature. By employing helium, krypton, xenon or argon, it is possible for UV radiation in the wave band of 90 nm, 150 nm or 170 nm to be generated with the radiation source disposed in the reactor vessel. The material provided for this purpose can be introduced into the reactor vessel in a gaseous compound for the purpose of coating. On the other hand, it is possible to apply an organic or inorganic compound to the substrate from a solution or in powder form, and to decompose the same with the aid of the UV radiation, with the desired coating being formed on the substrate.

In accordance with another feature of the invention, the apparatus according to the invention is preferably constructed as a cylindrical reactor vessel which can be sealed.

In accordance with a further feature of the invention, the UV radiation source is in the form of electrodes which are constructed as elongated or stretched hollow bodies. The electrodes are preferably formed as hollow cylinders, which are produced from glass or metal. The surface of the electrodes produced from metal have a coating made of a dielectric. The inside of the electrodes produced from glass are provided with a metal coating. The electrodes are disposed in such a way that the longitudinal axes thereof are parallel and disposed at a defined mutual clearance in so that a gap is formed between each two neighboring electrodes. The gaps preferably have a width of 0.1 to 10 mm. The electrodes themselves have a diameter of at least 8 mm. The electrodes are disposed with their longitudinal axes parallel to the upper surface of the reactor vessel.

In accordance with an added feature of the invention, the UV radiation source is disposed inside the reactor vessel in such a way that its clearance from the upwardly pointing upper surface of the reactor vessel is only a few centimeters.

In accordance with an additional feature of the invention, the feed line for a gas which forms the UV radiation is provided in the upper surface of the reactor vessel. The application of a high alternating voltage to each two neighboring electrodes, in conjunction with the introduction of a defined gas into the gaps between the electrodes, forms a quiet discharge in the gaps, and thereby generates UV radiation of a defined wavelength.

In accordance with yet another feature of the invention, the substrate to be coated is disposed on the lower surface or floor of the reactor vessel. The process gas, which is or contains a gaseous compound of the coating material, is introduced into the reactor vessel tangentially relative to the surface of the substrate to be coated at a defined clearance therefrom.

In accordance with yet a further feature of the invention, the in order to blanket the UV radiation source, or the UV radiation generated thereby, from impairment by the process gas, a blanketing gas is additionally introduced into the reactor vessel between the UV radiation source and the feed lines for the process gas.

In accordance with a concomitant feature of the invention, the gases introduced can be pumped away out of the interior of the reactor vessel through a drain in the lower surface or floor of the reactor vessel.

Other features which are considered as characteristic for the invention are set forth in the appended claims.

Although the invention is illustrated and described herein as embodied in a coating apparatus, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

Figure 1:
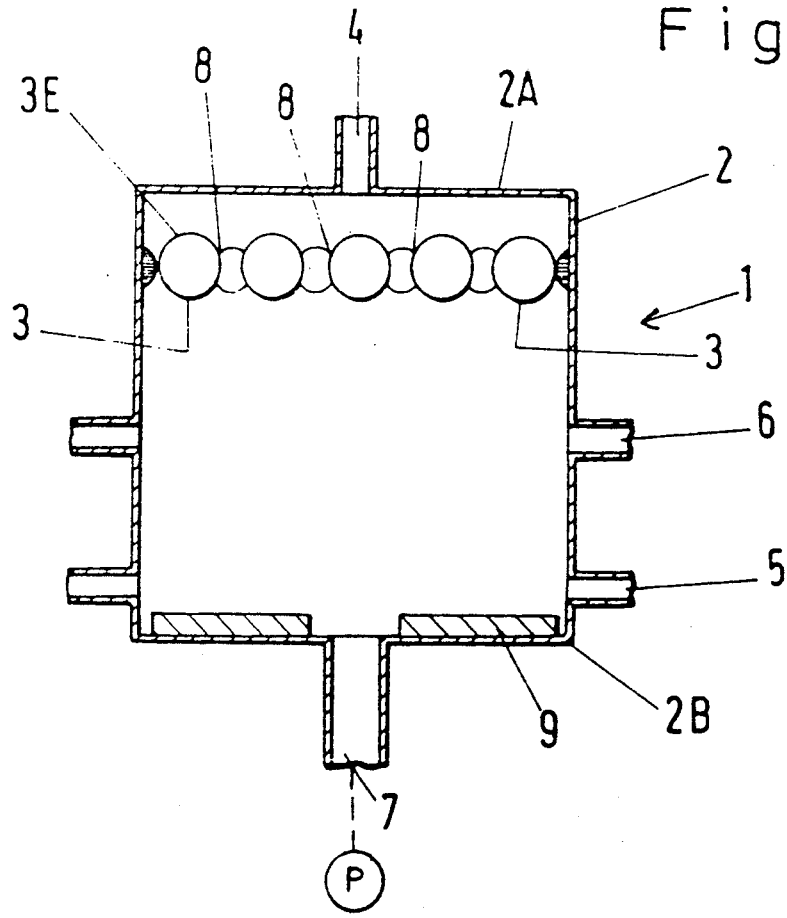
FIG. 1 is a fragmentary, diagrammatic, sectional view of an apparatus according to the invention for coating substrates.

Referring now to the figures of the drawing in detail and first, particularly, to FIG. 1 thereof, there is seen a coating apparatus 1 according to the invention, which is essentially formed of a reactor vessel 2, a UV radiation source 3, feed lines 4, 5 and 6 for gases, and a drain 7 for gases. In the illustrative embodiment represented in this case, the reactor vessel 2 is constructed as a cylindrical body, which is sealed at the ends thereof by upper and lower surfaces 2A and 2B. A corrosion-resistant material, preferably steel, is employed to produce the reactor vessel 2. The height of the reactor vessel is approximately 30 cm. However, it can also be constructed with a smaller or larger height. In the illustrative embodiment represented in this case, the diameter of the reactor vessel 2 is likewise 30 cm. Of course, these dimensions can also be chosen to be larger or smaller. The UV radiation source 3 is disposed in the interior of the reactor vessel 2 at a clearance of approximately 4 cm from the upper surface 2A of the reactor vessel 2. The UV radiation source 3 is formed of a plurality of electrodes 3E. In the illustrative embodiment represented in this case, five electrodes 3E are represented. Of course, it is possible to employ more or less electrodes 3E according to the invention. The electrodes 3E are constructed as hollow cylinders and are produced from glass or metal.

Figure 2:
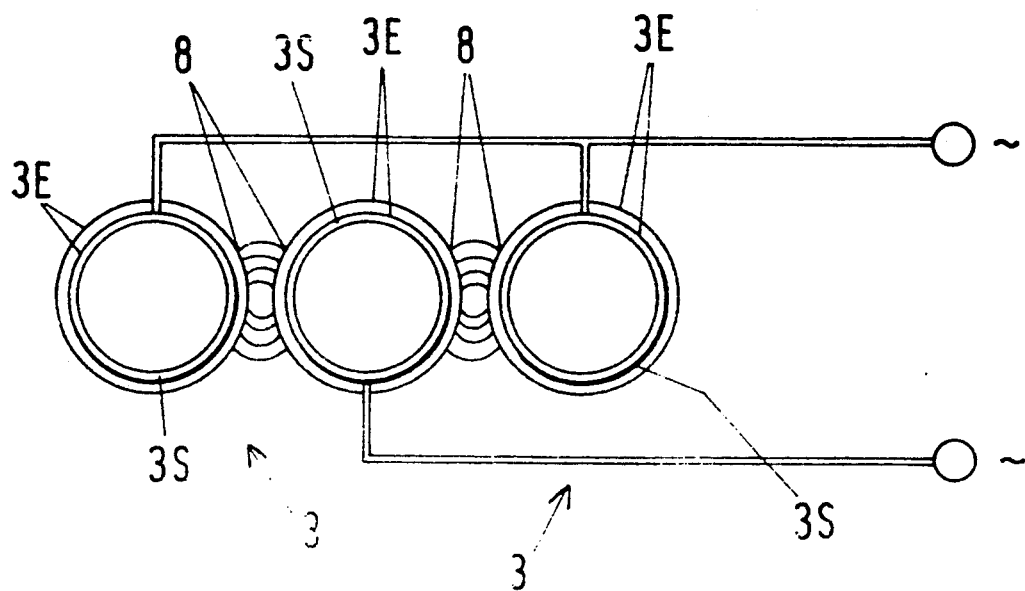
FIG. 2 is an enlarged elevational view of the UV radiation source disposed in the apparatus according to the invention.

A subregion of the UV radiation source 3 is represented in FIG. 2. The electrodes 3E shown in this case are produced from metal and have surfaces 3S on which they have a coating 3U made of a dielectric. The longitudinal axes of the electrodes 3E are disposed mutually parallel at a defined clearance, in such a way that a gap 8 of defined width remains between each two neighboring electrodes 3E. The longitudinal axes of the electrodes 3E are disposed in a plane which is parallel to the upper surface 2A, so that the electrodes 3E all have a minimum clearance of approximately 4 cm from the upper surface 2A. The gap width between two neighboring electrodes 3E is from 0.1 to 10 mm. Each two neighboring electrodes are connected to a high alternating voltage. In the illustrative embodiment represented in this case, a power of 50 watts is fed to the UV radiation source 3.

Figure 3:
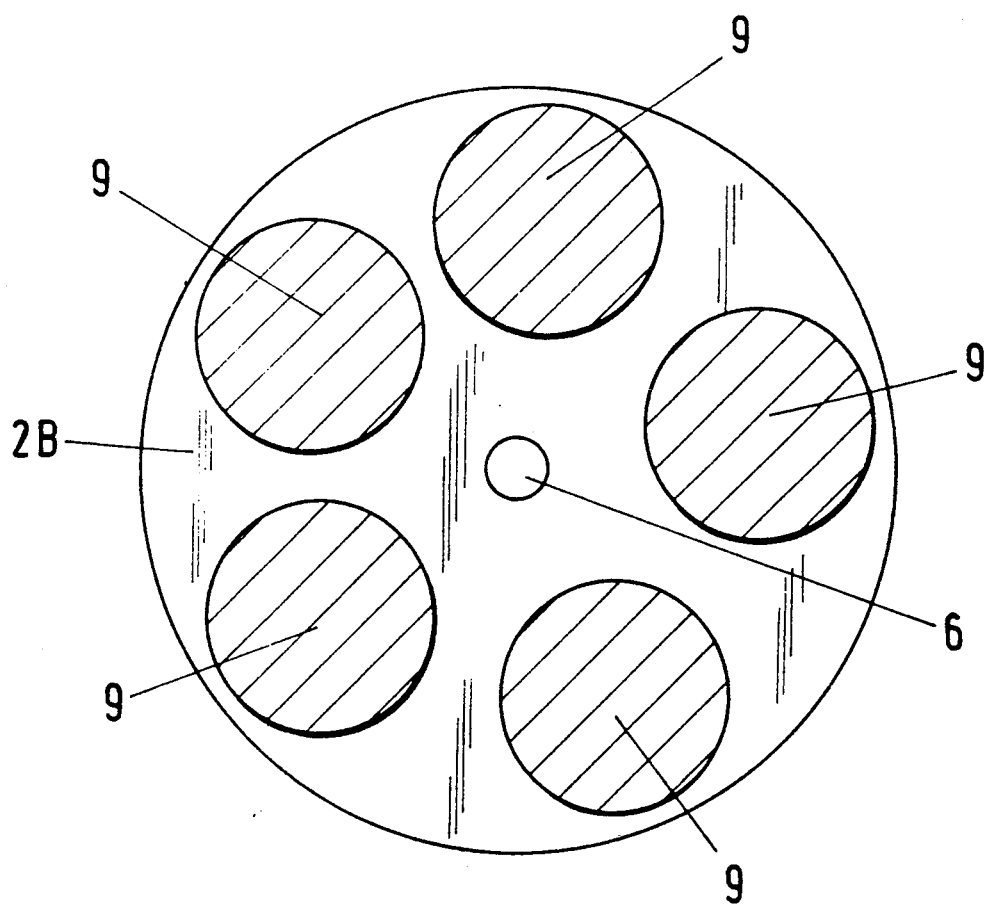
FIG. 3 is a partly sectional view of substrates to be coated inside the apparatus.

The feed line 4 for a gas is provided in the upper surface 2A of the reactor vessel 2. Helium, argon, krypton or xenon, for example, can be introduced into the reactor vessel 2 through the feed line 4. The gas introduced into the reactor vessel through the feed line 4 is distributed uniformly into the gaps 8 between the electrodes 3E. By applying a high alternating voltage to neighboring electrodes 3E, a quiet discharge is formed in the gaps 8, with the result being an emission of $He_2$, $Ar_2$, $Kr_2$ or $Xe_2$, depending upon the feeding of one of the above-mentioned gases. A UV radiation with a wavelength between 90 nm and 170 nm is generated with the aid of the radiation source 3, depending upon the gas employed. A process gas can be introduced into the reactor vessel 2 through feed lines 5, which are disposed in the side walls of the reactor vessel. The process gas is, or contains, a gaseous compound of the material to be deposited on the surface of at least one substrate 9. The substrate or substrates 9 are disposed on the lower surface 2B of the reactor vessel 2, as is represented in FIG. 3. In the illustrative embodiment represented in this case, the substrates 9 are constructed as round discs. However, they can also have a different shape. The drain 7 is provided in the middle of the lower surface or floor 2B. The gases which have been introduced into the reactor vessel 2 can be pumped away through the drain. The apparatus according to the invention is provided with a diagrammatically illustrated pump P, which enables a pressure of between 50 and 5,000 torr to be maintained inside the reactor vessel 2. In order to protect the UV radiation source 3, or the UV radiation generated thereby, against disturbing influences from the process gas, a blanketing gas is introduced into the reactor vessel 2 through the feed lines 6, which are disposed in the side walls of the reactor vessel 2. The feed lines 6 are disposed approximately halfway up the reactor vessel 2, so that it is possible to introduce the blanketing gas tangentially into the reactor vessel 2. The coating of a plurality of disc-shaped substrates 9, which are disposed on the lower surface 2B of the reactor vessel 2, is described below.

The substrates 9 can be formed of an organic or inorganic material. The surfaces of the substrates 9 to be coated are disposed in such a way that they are directly opposite the UV radiation source 3. In the illustrative embodiment represented in this case, the substrates 9 are to be coated with a silicon-containing layer, e.g. silicon dioxide or silicon nitride. Gaseous $SiH_4$ is employed as a coating material The $SiH_4$ does not adsorb until below 150 nm. Consequently, in order to carry out the photolytic dissociation, it is sensible to employ a UV radiation with a wavelength of between 120 and 135 nm, since this virtually coincides with the maximum adsorption of $SiH_4$. For this purpose, argon is led into the gaps 8 between the electrodes 3 through the feed line 4. As is described above, the electrodes 3 are connected to a high alternating voltage for this purpose. The flow of the argon through the gaps 8 generates an intensive UV radiation, having a maximum which is at approximately 128 nm, and a half-value width of approximately 10 nm. A photolytic dissociation of the process gas introduced into the reactor vessel 2 through the feed lines 5 is possible with the aid of this UV radiation.

In the illustrative embodiment represented in this case, the process gas is contained in a carrier gas, e.g. argon, and it is led over the surfaces of the substrates 9 by virtue of the special configuration of the feed lines 5, so that deposition of a silicon containing layer is possible. If a layer is to be deposited in the form of silicon dioxide or silicon nitride, additional proportions of oxygen or nitrogen are admixed with the process gas. Instead of argon, it is also possible for helium, krypton or xenon to be introduced through the feed line 4 if, e.g., the deposition of a different coating material requires UV radiation with a different wavelength between 90 nm and 170 nm, in order to carry out the photolytic dissociation. The reactor vessel 2 according to the invention can also be employed for coating substrates 9 if the coating material is not introduced in a gaseous form into the reactor vessel 2, but is instead applied directly from a solution or in the form of a powder onto the surface of the substrates, and then decomposed by means of UV radiation.

We claim:

1. Apparatus for coating a substrate having a surface, comprising a reactor vessel having an upper surface, side walls and a lower surface, a UV radiation source disposed in said reactor vessel, said UV radiation source including electrodes in the form of elongated hollow bodies having mutually parallel longitudinal axes disposed in a plane parallel to and substantially between 2 and 4 cm spaced apart from said upper surface of said reactor vessel, each two adjacent electrodes defining a gap therebetween having a width substantially between 0.1 and 10 mm, and a feed line disposed in said upper surface of said reactor vessel for emitting a gas selected from the group consisting of $Ar_2$, $Kr_2$, and $Xe_2$ to be introduced into said gaps, each two adjacent electrodes being connected to a high alternating voltage for feeding a power of substantially 50 watts to said UV radiation source and generating a quiet discharge in said gaps emitting UV radiation having a wavelength of substantially between 90nm and 170nm, feed lines for feeding a process gas disposed in said side walls of said vessel extending tangentially to the surface of the substrate and spaced apart therefrom by at least 2cm, and at least one feed line for a blanketing gas centrally disposed in one of said side walls, and at least one drain centrally disposed in said lower surface of said vessel for draining gases introduced into said reactor vessel, and a pump connected to said drain for exhausting gas.

2. Apparatus according to claim 1, wherein said electrodes are hollow glass cylinders having an inner metal coating.

3. Apparatus according to claim 1, wherein said electrodes are hollow metal cylinders having an outer dielectric coating.

4. Apparatus according to claim 1, wherein said reactor vessel is a cuboid.

5. Apparatus according to claim 1, wherein said reactor vessel is a cylinder.

6. Apparatus according to claim 1, wherein said reactor vessel is formed of a corrosion-resistant material.

7. Apparatus according to claim 1, wherein said reactor vessel is formed of corrosion-resistant steel.

* * * * *